(12) United States Patent
Cripe

(10) Patent No.: US 8,344,923 B1
(45) Date of Patent: Jan. 1, 2013

(54) POWER DIGITAL-ANALOG-CONVERTER WITH SWITCHED CAPACITOR VOLTAGE DIVISION

(75) Inventor: David W. Cripe, Mount Vernon, IA (US)

(73) Assignee: Rockwell Collins, Inc., Cedar Rapids, IA (US)

(*) Notice: Subject to any disclaimer, the term of this patent is extended or adjusted under 35 U.S.C. 154(b) by 79 days.

(21) Appl. No.: 13/093,894

(22) Filed: Apr. 26, 2011

(51) Int. Cl.
*H03M 1/66* (2006.01)
(52) U.S. Cl. .............. 341/144; 341/136; 341/150
(58) Field of Classification Search .......... 341/136, 341/144, 150
See application file for complete search history.

(56) References Cited

U.S. PATENT DOCUMENTS

| | | | | |
|---|---|---|---|---|
| 4,803,386 A | * | 2/1989 | Kraus et al. | 327/55 |
| 6,104,330 A | * | 8/2000 | Redman-White et al. | 341/150 |
| 6,639,533 B2 | * | 10/2003 | Moon | 341/144 |

* cited by examiner

*Primary Examiner* — Khai M Nguyen
(74) *Attorney, Agent, or Firm* — Donna P. Suchy; Daniel M. Barbieri

(57) ABSTRACT

A digital signal power amplification apparatus with multiple digital amplification cells connected in series, each amplification cell processing a separate bit of the digital signal. The apparatus additively combines the output from each amplifier into a single amplified signal without the use of separate signal combining circuitry. The apparatus has high linearity, high efficiency, high bandwidth and high power.

20 Claims, 4 Drawing Sheets

|  | First High<br>Second High | First High<br>Second Low | First Low<br>Second High | First Low<br>Second Low |
|---|---|---|---|---|
| High Output Node | $V_{max}$ | ¾ $V_{max}$ | ½ $V_{max}$ | ¼ $V_{max}$ |
| Low Output Node | ¾ $V_{max}$ | ½ $V_{max}$ | ¼ $V_{max}$ | $V_{min}$ |

FIG. 4

|  | First High<br>Second High<br>Third High | First High<br>Second High<br>Third Low | First High<br>Second Low<br>Third High | First High<br>Second Low<br>Third Low |
|---|---|---|---|---|
| High Output Node | $V_{max}$ | ⅞ $V_{max}$ | ¾ $V_{max}$ | ⅝ $V_{max}$ |
| Low Output Node | ⅞ $V_{max}$ | ¾ $V_{max}$ | ⅝ $V_{max}$ | ½ $V_{max}$ |

|  | First Low<br>Second High<br>Third High | First Low<br>Second High<br>Third Low | First Low<br>Second Low<br>Third High | First Low<br>Second Low<br>Third Low |
|---|---|---|---|---|
| High Output Node | ½ $V_{max}$ | ⅜ $V_{max}$ | ¼ $V_{max}$ | ⅛ $V_{max}$ |
| Low Output Node | ⅜ $V_{max}$ | ¼ $V_{max}$ | ⅛ $V_{max}$ | $V_{min}$ |

FIG. 5

|  | Fourth High<br>Fifth High | Fourth High<br>Fifth Low | Fourth Low<br>Fifth High | Fourth Low<br>Fifth Low |
|---|---|---|---|---|
| Analog Output | $V_{high}$ | ½ ($V_{high}$ + $V_{low}$) | 1½ ($V_{high}$ + $V_{low}$) | $V_{low}$ |

POWER DIGITAL-ANALOG-CONVERTER WITH SWITCHED CAPACITOR VOLTAGE DIVISION

FIELD OF THE INVENTION

The present invention is directed generally toward signal amplification; specifically amplification of a digital signal.

BACKGROUND OF THE INVENTION

The challenge of radio frequency (RF) power amplifiers is to combine high efficiency, high bandwidth, high linearity, and high power. One potential architecture solution is the power digital-analog-converter (PowerDAC). The Power-DAC concept utilizes a digital data stream directly applied to the control of switching-power-amplifiers in a manner analogous to that of more conventional DAC circuits. In frequency ranges of multiple decades (VHF and UHF), and in a dynamic range fourteen bits or greater, conventional power amplifier technology and combiner techniques are inadequate.

The class-D power amplifier can operate efficiently through multiple decades of bandwidth. The class-D amplifier is a switching amplifier; therefore the voltage amplitude of its output is determined directly by its power supply voltage. Class-D amplifiers can suffer from high output resistance. OSISE is an optically-coupled, isolated, gate-drive circuit permitting fabrication of broadband class-D power amplifiers with high-side, floating-source switches, OSISE circuits are a significant development because they allow fabrication of broad-band totem pole, class-D half-bridges. Totem-pole architecture Class-D amplifiers are capable of producing RF power without output baluns or transformers.

Separate PowerDAC circuits may amplify individual bit streams. However, it is difficult to combine the output from separate PowerDACs. Separate signals require separate combining circuitry, which may require filtering and de-coupling. Combining analog conversions of digital signals is ineffective unless the amplification voltage is precise for each progressively less significant bit. Where PowerDAC circuits are separate, there may be no direct relation between the amplification voltages for each bit.

Consequently, it would be advantageous if an apparatus existed that is suitable for amplifying a digital signal and converting the digital signal to an analog signal without the use of separate combining circuitry.

SUMMARY OF THE INVENTION

Accordingly, the present invention is directed to a novel apparatus for amplifying a digital signal and converting the digital signal to an analog signal without the use of separate combining circuitry. The apparatus combines high efficiency, high bandwidth, high linearity and high power.

An apparatus according to the present invention may have a plurality of bit amplifying cells. Each bit amplifying cell amplifies a single bit of the digital signal. Each amplifying cell receives a digital control signal, as well as a precisely-determined supply voltage, and produces as its output, two separate output voltages, with a differential voltage one half the differential voltage of that cell's supply voltage. Each amplifying cell is connected in series to a subsequent amplifying cell so that the output voltages of one amplifying cell become the supply voltages of the next amplifying cell.

Each bit amplifying cell may have capacitors arranged in series between the upper and lower inputs of its supply voltage. The common node of the capacitors may have a common node reference voltage one-half the average of that cell's differential supply voltage. The capacitors de-couple the bit amplifying cells.

Each bit amplifying cell may have two sets of transistors, each set of transistors arranged in a manner similar to a class-D amplifier. One set of transistors may have that cell's positive supply voltage and the common node reference voltage as amplification voltages. The other set of transistors may have the common node reference voltage and that cell's negative supply voltage as amplification voltages. The output of each set of transistors may become the differential supply voltages for the next bit amplifying cell.

The apparatus may also contain an amplifier termination cell connected in series to the chain of bit amplifying cells. The termination cell may correspond to the Least significant bit (LSB) of the system.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles.

BRIEF DESCRIPTION OF THE DRAWINGS

The numerous objects and advantages of the present invention may be better understood by those skilled in the art by reference to the accompanying figures in which:

FIG. 4 shows a table of possible node voltages for a second bit amplifying cell based on possible bit states of a first and second bits;

FIG. 5 shows a table of possible node voltages for a third bit amplifying cell based on possible bit states of a first, second and third bit;

FIG. 6 shows a table of possible analog output voltages for an amplifier termination cell according to the present invention;

DETAILED DESCRIPTION OF THE INVENTION

Reference will now be made in detail to the subject matter disclosed, which is illustrated in the accompanying drawings. The scope of the invention is limited only by the claims; numerous alternatives, modifications and equivalents are encompassed. For the purpose of clarity, technical material that is known in the technical fields related to the embodiments has not been described in detail to avoid unnecessarily obscuring the description.

Figure 1:
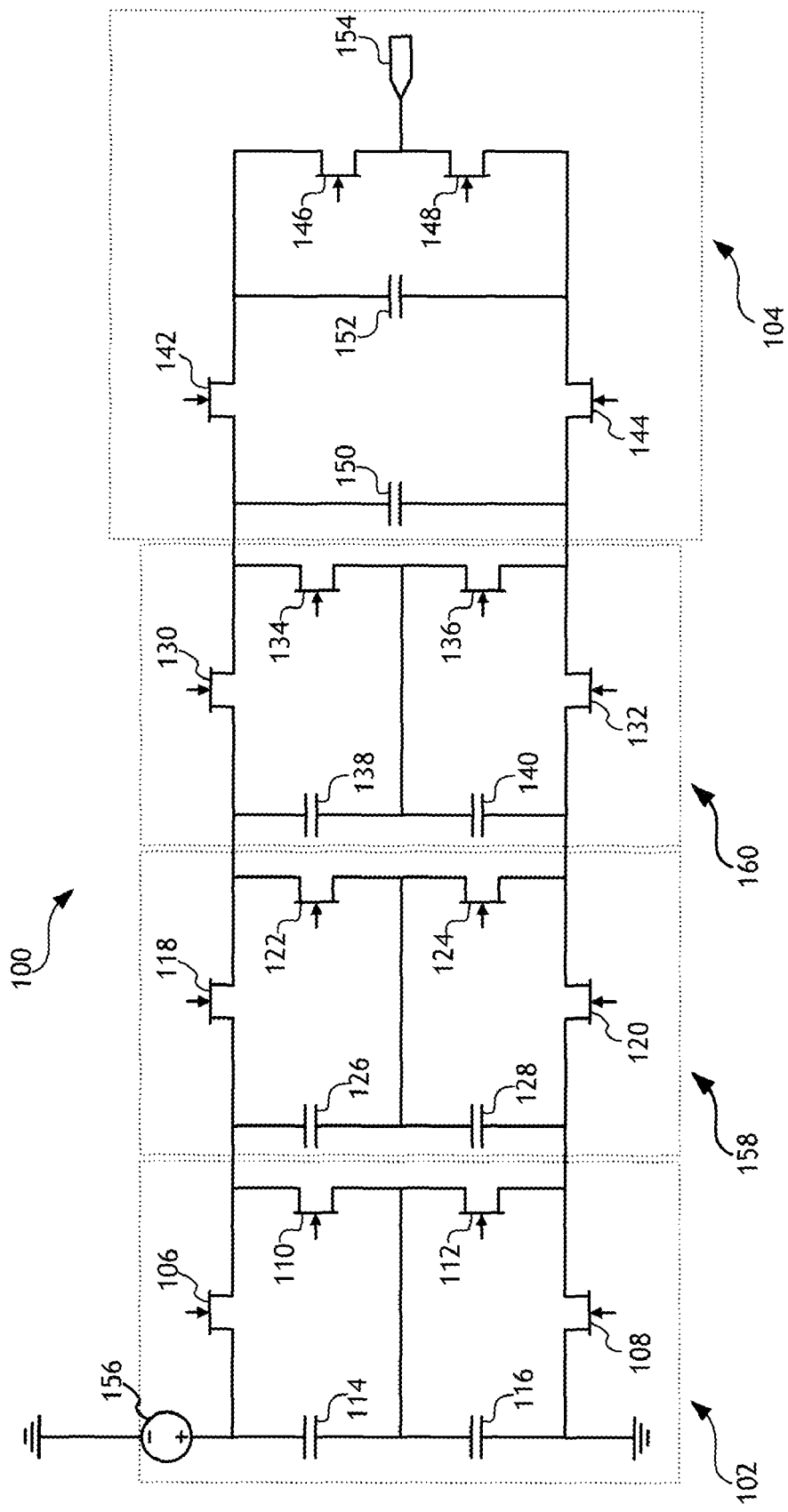
FIG. 1 shows a diagram of a circuit according to one embodiment of the present invention.

Referring to FIG. 1, one embodiment of a power digital-analog-converter (DAC) 100 according to the present invention may comprise one or more bit amplifying cells 102, 158, 160 connected in series. The Power DAC 100 may have an amplifier termination cell 104 connected in series to the series of bit amplifying cells 102, 158, 160. Each bit amplifying cell 102, 158, 160 amplifies a single bit in a digital signal. Each bit may be represented by an appropriate rectangular waveform. A single bit amplifying cell is shown in FIG. 2,

Generalized Bit Amplifying Cell

Figure 2:
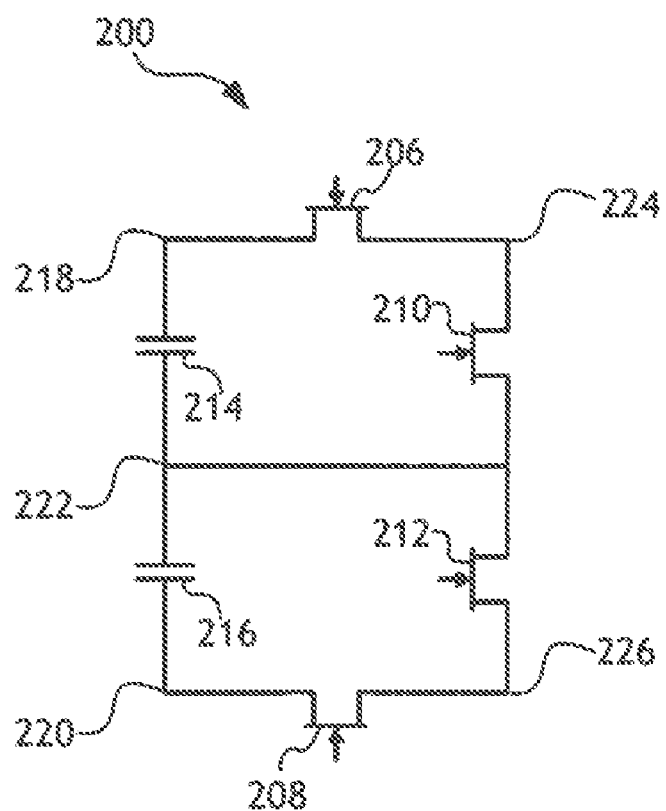
FIG. 2 shows a diagram of a single bit amplifying circuit according to one embodiment of the present invention.

Referring to FIG. 2, a single bit amplifying cell 200 is shown. The bit amplifying cell 200 may have a high bit transistor 206, a low bit transistor 212, a high bit complimentary transistor 210, and a low bit complimentary transistor 208. The bit amplifying cell 200 may also have a high voltage control capacitor 214 and a low voltage control capacitor 216 connected to each other in series.

The high voltage control capacitor may connect to a high input node 218 and an intermediate node 222. The to voltage control capacitor 216 may connect to the intermediate node 222 and a low input node 220. The high voltage control capacitor 214 and low voltage control capacitor 216 work to de-couple the bit amplifying cell 200 from any previous bit amplifying cells in the operating range of a circuit containing the bit amplifying cell 200. A circuit containing the bit amplifying cell, 200 may operate in the radio frequency range or any frequency range wherein the switching speed of the transistors is adequate. The high voltage control capacitor 214 and low voltage control capacitor 216 in each bit amplifying cell 200 perform switched-capacitor power conversion to create a floating voltage source at the intermediate node 222, of an amplitude half that of the supply preceding it.

The source of the high bit transistor 206 may connect to the high input node 218 and the drain may connect to a high output node 224. The source of the high bit complimentary transistor 210 may connect to the intermediate node 222 and the drain may connect to the high output node 224. The source of the low bit complimentary transistor 208 may connect to the low input node 220 and the drain may connect to a low output node 226. The source of the low bit transistor 212 may connect to the intermediate node 222 and the drain may connect to the low output node 226.

A bit may drive the high bit transistor 206 and the low bit transistor 212 through isolated drive circuitry connected to the gate of each transistor 206, 212. A complimentary first bit may drive the high bit complimentary transistor 210 and the low bit complimentary transistor 208 through isolated drive circuitry connected to the gate of each transistor 208, 210.

Two bit amplifying cells 200 may be connected in series by connecting the high output node 224 of a primary bit amplifying cell to the high input node 218 of a secondary bit amplifying cell, and connecting the low output node 226 of the primary bit amplifying cell to the low input node 220 of the secondary bit amplifying

First Bit Amplifying Cell

Referring to FIG. 1 and FIG. 2, FIG. 1 shows a first bit amplifying cell 102, a second bit amplifying cell 158, a third bit amplifying cell 160 and an amplifier termination cell 104 all connected in series. Each bit amplifying cell 102, 158, 160 is an implementation of the generalized bit amplifying cell 200, amplifying successively Less significant bits in a digital signal.

The high input node 218 of the first bit amplifying cell 102 may connect to an amplifying voltage source 156. The amplifying voltage source 156 supplies a voltage that represents the maximum available signal amplification voltage ($V_{max}$). The low input node 220 of the first bit amplifying cell 102 may be tied to ground or some other minimum amplification voltage ($V_{min}$). In this disclosure, $V_{min}$ is assumed to be zero for simplicity; however it will be apparent to one skilled in the art that $V_{min}$ need not be zero. In this configuration, the differential voltage between the high input node 218 and the low input node 220 of the first bit amplifying cell 102 is $V_{max}$. The first bit amplifying cell 102 may have an intermediate node 222 defined by the common node of a high first bit voltage control capacitor 114 and a low first bit voltage control capacitor 116 connected in series between the high input node 218 and the low input node 220 of the first bit amplifying cell 102. The differential voltage between the high input node 218 and the intermediate node 222 of the first bit amplifying cell 102 is ½ $V_{max}$.

A rectangular wave of sufficient amplitude to drive a transistor into a high state represents a first bit in a digital signal. The first bit connects to the gate of the high first bit transistor 106 and the gate of the low first bit transistor 112 through appropriate isolated drive circuitry. A complimentary rectangular wave of sufficient amplitude represents a complimentary first bit. The complimentary first bit is the logical opposite of the first bit; whenever the first bit is in a high state, the complimentary first bit is in a low state, and whenever the first bit is in a low state, the complimentary first bit is in a high state. The complimentary first bit connects to the gate of the high first bit complimentary transistor 110 and the gate of the low first bit complementary transistor 108 through appropriate isolated drive circuitry.

Whenever the first bit is in a high voltage state the high first bit transistor 106 and the low first bit transistor 112 are driven into a high state. Furthermore, whenever the first bit is in a high voltage state, the complimentary first bit is in a low voltage state. The complimentary first bit being in a low voltage state, the high first bit complimentary transistor 110 and the low first bit complimentary transistor 108 are driven into a low state.

In this embodiment, when the first bit is in a high voltage state, current may flow through the high first bit transistor 106 and the low first bit transistor 112. Current may not flow through the high first bit complimentary transistor 110 or the low first bit complimentary transistor 108. Therefore, the high output node 224 would be at the same voltage as the high input node 218, or $V_{max}$. Meanwhile, the low output node 226 would be at the same voltage as the intermediate node 222, or ½ $V_{max}$.

On the other hand, if the first bit is in a low voltage state the high first bit transistor 106 and the low first bit transistor 112 are driven into a to state. When the first bit is in a low voltage state, the complimentary first bit is in a high voltage state. When the complimentary first bit is in a high voltage state, the high first bit complimentary transistor 110 and the low first bit complimentary transistor 108 are driven into a high state.

In this embodiment, when the first bit is in a low voltage state, current may flow through the high first bit complimentary transistor 110 and the low first bit complimentary transistor 108. Current may not flow through the high first bit transistor 106 or the low first bit transistor 112. Therefore, the high output node 224 would be at the same voltage as the intermediate node 222, or ½ $V_{max}$. Meanwhile, the low output node 226 would be at the same voltage as the low input node 220, or $V_{min}$.

The first bit amplifying cell 102 may generate two possible sets of output voltages based on a first bit of digital input. When the first bit is high, the high output node 224 is at voltage $V_{max}$ while the low output node 226 is at voltage ½ $V_{max}$. When the first bit is low, high output node 224 is at voltage ½ $V_{max}$ while the low output node 226 is at voltage $V_{min}$. In both cases, the differential voltage between the high output node 224 and the low output node 226 is ½ $V_{max}$.

Second it Amplifying Cell

The first bit amplifying cell 102 connects to the second bit amplifying cell 158 in series such that the high output node 224 of the first bit amplifying cell 102 shares a common node, and therefore a common voltage with the high input node 218 of the second bit amplifying cell 158. Furthermore, the low output node 226 of the first bit amplifying cell 102 shares a common node, and therefore a common voltage with the low input node 220 of the second bit amplifying cell 158. As with the first bit amplifying cell 102, the second bit amplifying cell 158 may have an intermediate node 222 defined by the common node of a high second bit voltage control capacitor 126 and a low second bit voltage control capacitor 128 connected in series between the high input node 218 and the low input node 220 of the second bit amplifying cell 158. The intermediate node 222 of the second bit amplifying cell may be at a voltage half-way between the voltage at the high input node 218 of the second bit amplifying cell 158 and the voltage at the low input node 220 of the second bit amplifying cell 158. Unlike the voltage at the intermediate node 222 of first bit amplifying cell 120, the voltage at the intermediate node 222 of the second bit amplifying cell 158 depends on the state of the first bit. If the first bit is high, the high input node 218 of the second bit amplifying cell 158 would be at $V_{max}$ while the low input node 220 would be at $½ V_{max}$. In that case the intermediate node 222 of the second bit amplifying cell 158 would be at $¾ V_{max}$. Conversely, if the first bit is low, the high input node 218 of the second bit amplifying cell 158 would be at $½ V_{max}$ white the low input node 220 would be at $V_{min}$. In that case the intermediate node 222 of the second bit amplifying cell 158 would be at $½ V_{max}$. In either case, the differential voltage between the intermediate node 222 and the high input node 218 of the second amplifying cell 158 is one-half the differential voltage between the intermediate node 222 and the high input node 218 of the first bit amplifying cell 102. Likewise, the differential voltage between the intermediate node 222 and the low input node 220 of the second amplifying cell 158 is one-half the differential voltage between the intermediate node 222 and the low input node 220 of the first bit amplifying cell 102.

A rectangular wave of sufficient amplitude to drive a transistor into a high state represents a second bit in the digital signal. The second bit connects to the gate of the high second bit transistor 118 and the gate of the low second bit transistor 124 through appropriate isolated drive circuitry. A complimentary rectangular wave of sufficient amplitude represents a complimentary second bit. The complimentary second bit is the Logical opposite of the second bit; whenever the second bit is in a high state, the complimentary second bit is in a low state, and whenever the second bit is in a low state, the complimentary second bit is in a high state. The complimentary second bit connects to the gate of the high second bit complimentary transistor 122 and the gate of the low second bit complementary transistor 120 through appropriate isolated drive circuitry.

Whenever the second bit is in a high voltage state the high second bit transistor 118 and the low second bit transistor 124 are driven into a high state. Furthermore, whenever the second bit is in a high voltage state, the complimentary second bit is in a low voltage state. The complimentary second bit being in a low voltage state, the high second bit complimentary transistor 122 and the low second bit complimentary transistor 120 are driven into a low state.

In this embodiment, as with the first bit amplifying cell 102, when the second bit is in a high voltage state, current may flow through the high second bit transistor 118 and the to second bit transistor 124. Current may not flow through the high second bit complimentary transistor 122 or the low second bit complementary transistor 120. Therefore, the high output node 224 would be at the same voltage as the high input node 218 while the low output node 226 would be at the same voltage as the intermediate node 222. Unlike the first bit amplifying cell 102, the voltage at the high output node 224 and low output node 226 of the second bit amplifying cell 158 depend on the state of the first bit as well as the second bit because the first bit determines the voltage at the high input node 218 and low input node 220 of the second bit amplifying cell 158.

If the second bit is in a low voltage state the high second bit transistor 118 and the low second bit transistor 124 are driven into a low state. When the second bit is in a low voltage state, the complimentary second bit is in a high voltage state. When the complimentary second bit is in a high voltage state, the high second bit complimentary transistor 122 and the low second bit complimentary transistor 120 are driven into a high state.

In this embodiment, again as with the first bit amplifying cell 102, when the second bit is in a low voltage state, current may flow through the high second bit complimentary transistor 122 and the low second bit complimentary transistor 120. Current may not flow through the high second bit transistor 118 or the low second bit transistor 124. Therefore, the high output node 224 would be at the same voltage as the intermediate node 222 while the low output node 226 would be at the same voltage as the low input node 220. Again, the voltage at the high output node 224 and low output node 226 of the second bit amplifying cell 158 depend on the state of the first bit as well as the second bit because the first bit determines the voltage at the high input node 218 and low input node 220 of the second bit amplifying cell 158.

The second bit amplifying cell 158 may generate four possible sets of output voltages based on a second bit of digital input, and the state of a prior first bit amplifying cell 102. The table below (FIG. 4) shows possible states for the high output node 224 and the low output node 226 of the second bit amplifying cell 158.

|  | First High Second High | First High Second Low | First Low Second High | First Low Second Low |
|---|---|---|---|---|
| High Output Node | $V_{max}$ | $¾ V_{max}$ | $½ V_{max}$ | $¼ V_{max}$ |
| Low Output Node | $¾ V_{max}$ | $½ V_{max}$ | $¼ V_{max}$ | $V_{min}$ |

Third Bit Amplifying Cell

The second bit amplifying cell 158 connects to the third bit amplifying cell 160 in series such that the high output node 224 of the second bit amplifying cell 158 shares a common node, and therefore a common voltage with the high input node 218 of the third bit amplifying cell 160. Furthermore, the low output node 226 of the second bit amplifying cell 158 shares a common node, and therefore a common voltage with the Low input node 220 of the third bit amplifying cell 160. As with the first bit amplifying cell 102 and second bit amplifying cell 158, the third bit amplifying cell 160 may have an intermediate node 222 defined by the common node of a high third bit voltage control capacitor 138 and a low third bit voltage control capacitor 140 connected in series between the high input node 218 and the low input node 220 of the third bit amplifying cell 160. The intermediate node 222 of the third bit amplifying cell may be at a voltage half-way between the voltage at the high input node 218 of the third bit amplifying cell, 160 and the voltage at the to input node 220 of the third bit amplifying cell 160. The voltage at the intermediate node 222 of the third bit amplifying cell 160 depends on the state of the first bit and the second bit. The voltage at the intermediate node 222 of the third amplifying cell as measured from the low input node 220 is half the differential voltage between the low input node 220 and the high input node 218 of the third amplifying cell 160 for each first and second bit state shown in the table above and in FIG. 4.

A rectangular wave of sufficient amplitude to drive a transistor into a high state represents a third bit in the digital signal. The third bit connects to the gate of the high third bit transistor 130 and the gate of the low third bit transistor 136 through appropriate isolated drive circuitry. A complimentary rectangular wave of sufficient amplitude represents a complimentary third bit. The complimentary third bit is the logical opposite of the third bit; whenever the third bit is in a high state, the complimentary third bit is in a low state, and whenever the third bit is in a to state, the complimentary third bit is in a high state. The complimentary third bit connects to the gate of the high third bit complimentary transistor 134 and the gate of the low third bit complementary transistor 132 through appropriate isolated drive circuitry.

Whenever the third bit is in a high voltage state the high third bit transistor 130 and the low third bit transistor 136 are driven into a high state. Furthermore, whenever the third bit is in a high voltage state, the complimentary third bit is in a to voltage state. The complimentary third bit being in a low voltage state, the high third bit complimentary transistor 134 and the low third bit complimentary transistor 132 are driven into a low state.

In this embodiment, as with the first and second bit amplifying cells 102, 158, when the third bit is in a high voltage state, current may flow through the high third bit transistor 130 and the low third bit transistor 136. Current may not flow through the high third bit complimentary transistor 134 or the low third bit complimentary transistor 132. Therefore, the high output node 224 would be at the same voltage as the high input node 218 while the low output node 226 would be at the same voltage as the intermediate node 222. The voltage at the high output node 224 and low output node 226 of the third bit amplifying cell 160 depend on the state of the first and second bits as well as the third bit because the first and second bits determines the voltage at the high input node 218 and low input node 220 of the third bit amplifying cell, 160.

If the third bit is in a low voltage state the high third bit transistor 130 and the low third bit transistor 136 are driven into a low state. When the third bit is in a low voltage state, the complimentary third bit is in a high voltage state. When the complimentary third bit is in a high voltage state, the high third bit complimentary transistor 134 and the low third bit complimentary transistor 132 are driven into a high state.

In this embodiment, again as with the first and second bit amplifying cells 102, 158, when the third bit is in a low voltage state, current may flow through the high third bit complimentary transistor 134 and the low third bit complimentary transistor 132. Current may not flow through the high third bit transistor 130 or the low third bit transistor 136. Therefore, the high output node 224 would be at the same voltage as the intermediate node 222 while the low output node 226 would be at the same voltage as the low input node 220. Again, the voltage at the high output node 224 and low output node 226 of the third bit amplifying cell 160 depend on the state of the first and second bits as well as the third bit because the first and second bits determine the voltage at the high input node 218 and low input node 220 of the third bit amplifying cell 160.

The third bit amplifying cell 160 may generate eight possible sets of output voltages based on a third bit of digital input, and the state of prior first and second bit amplifying cells 158. The table below (FIG. 5) shows possible states for the high output node 224 and the low output node 226 of the third bit amplifying cell 160.

|  | First High Second High Third High | First High Second High Third Low | First High Second Low Third High | First High Second Low Third Low |
|---|---|---|---|---|
| High Output Node | $V_{max}$ | $7/8\,V_{max}$ | $3/4\,V_{max}$ | $5/8\,V_{max}$ |
| Low Output Node | $7/8\,V_{max}$ | $3/4\,V_{max}$ | $5/8\,V_{max}$ | $1/2\,V_{max}$ |

|  | First Low Second High Third High | First Low Second High Third Low | First Low Second Low Third High | First Low Second Low Third Low |
|---|---|---|---|---|
| High Output Node | $1/2\,V_{max}$ | $3/8\,V_{max}$ | $1/4\,V_{max}$ | $1/8\,V_{max}$ |
| Low Output Node | $3/8\,V_{max}$ | $1/4\,V_{max}$ | $1/8\,V_{max}$ | $V_{min}$ |

Each bit amplifying cell 102, 158, 160 operates at a differential input voltage one-half the differential input voltage of the previous bit amplifying cell. That is to say each bit amplifying cell 102, 158, 160 operates in a voltage range one order of magnitude less on a binary scale than the previous bit amplifying cell. Therefore, each bit amplifying cell 102, 158, 160 modifies the output voltage of the series of bit amplifying cells by a factor appropriate to convert a binary signal to an analog signal without any additional signal combining circuitry.

Amplifier Termination Cell

The series of bit amplifying cells 102, 158, 160 connects to an amplifier termination cell 104. The amplifier termination cell 104 resolves the voltage difference between the high output node 224 and the low output node 226 of the final bit amplifying cell, in this case the third bit amplifying cell 160. The amplifier termination cell 104 also incorporates the final two least significant bits (LSB) in the digital signal.

Figure 3:
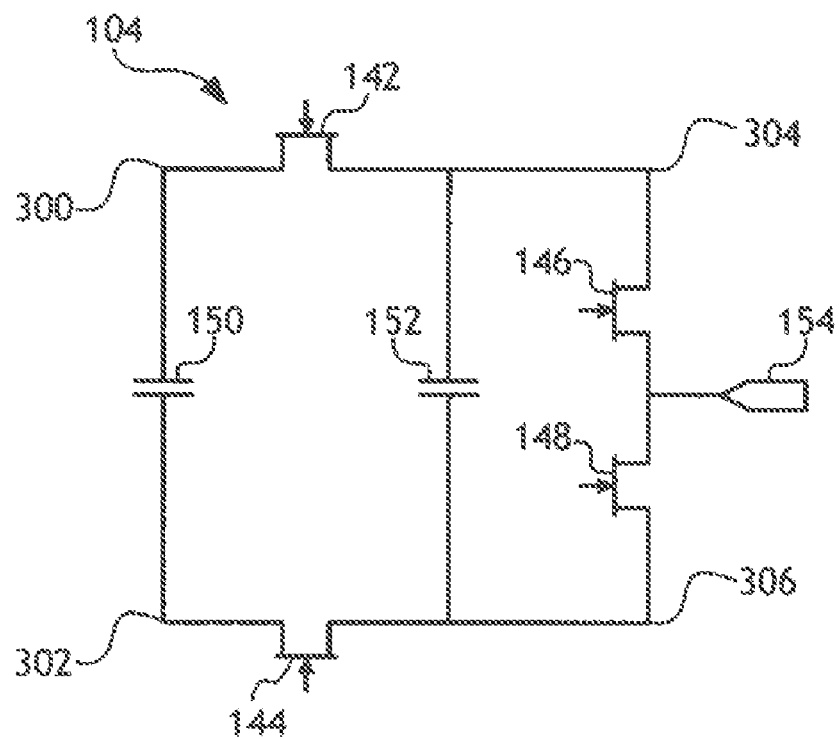
FIG. 3 shows a diagram of a amplifier termination circuit according to one embodiment of the present invention.

Referring to FIG. 3, an amplifier termination cell 104 according to the present invention may have a fourth bit voltage control capacitor 150, a fifth bit voltage control capacitor 152, a fourth bit transistor 142, a fourth bit complimentary transistor 144, a fifth bit transistor 146 and a fifth bit complimentary transistor 148. The fourth bit voltage control capacitor 150 may connect at one terminal to a high LSB input node 300 and at the other terminal to a low LSB input node 302. The source of the fourth bit transistor 142 may connect to the high LSB input node 300 and the drain of the fourth bit transistor 142 may connect to a high LSB output node 304. The source of the fourth bit complimentary transistor 144 may connect to the low LSB input node 302 while the drain of the fourth bit complimentary transistor 114 may connect to a low LSB output node 306. The fifth bit voltage control capacitor 152 may connect at one terminal to the high LSB output node 304 and at the other terminal to the low LSB output node 306. The source of the fifth bit transistor 146 may connect to the high LSB output node 304 while the drain of the fifth bit transistor may connect to the analog output 154. The source of the fifth bit complimentary transistor 148 may connect to the low LSB output 306 while the drain of the fifth bit complimentary transistor 148 may connect to the analog output 154.

The amplifier termination cell 104 resolves the two least significant bits in the digital signal into a single voltage with three potential values; +LSB, 0 or −LSB. The actual voltage value of LSB is dependent on the number of preceding bit amplifying cells 102, 158, 160 wherein each preceding bit amplifying cell reduces the voltage value of LSB by one-half and the amplifier termination cell 104 also reduces the voltage value of LSB by one-half, in the present embodiment, LSB would represent a voltage change of $1/16\ V_{max}$ in the final analog output 154.

A rectangular wave of sufficient amplitude to drive a transistor into a high state represents a fourth bit in the digital signal. The fourth bit connects to the gate of the fourth bit transistor 142 through appropriate isolated drive circuitry. A complimentary rectangular wave of sufficient amplitude represents a complimentary fourth bit. The complimentary fourth bit is the logical opposite of the fourth bit; whenever the fourth bit is in a high state, the complimentary fourth bit is in a low state, and whenever the fourth bit is in a low state, the complimentary fourth bit is in a high state. The complimentary fourth bit connects to the gate of the fourth bit complimentary transistor 144 through appropriate isolated drive circuitry.

A rectangular wave of sufficient amplitude to drive a transistor into a high state represents a fifth bit in the digital signal. The fifth bit connects to the gate of the fifth bit transistor 146 through appropriate isolated drive circuitry. A complimentary rectangular wave of sufficient amplitude represents a complimentary fifth bit. The complimentary fifth bit is the logical opposite of the fifth bit; whenever the fifth bit is in a high state, the complimentary fifth bit is in a low state, and whenever the fifth bit is in a low state, the complimentary fifth bit is in a high state. The complimentary fifth bit connects to the gate of the fifth bit complimentary transistor 148 through appropriate isolated drive circuitry.

Whenever the fourth bit is in a high voltage state the fourth bit transistor 142 is driven into a high state. Furthermore, whenever the fourth bit is in a high voltage state, the complimentary fourth bit is in a low voltage state. The complimentary fourth bit being in a low voltage state, the fourth bit complimentary transistor 144 is driven into a low state. In this embodiment, the voltage at the high LSB output 304 would be equal to the voltage at the high LSB input 300, and the voltage at the low LSB output 306 would be equal to the voltage at the high LSB output 304 minus a voltage drop equal to the voltage value of one LSB due to voltage stored in the fifth voltage control capacitor 152. In this case, if the fifth bit is in a high voltage state, the fifth bit transistor 146 is driven high while the fifth bit complimentary transistor 148 is driven low. Current may flow through the fifth bit transistor 146, and the voltage at the analog output will be equal to the voltage at the high LSB output 304. If the fifth bit is in a low voltage state, the fifth bit transistor 146 is driven low while the fifth bit complimentary transistor 148 is driven high. Current may flow through the fifth bit complimentary transistor 148, and the voltage at the analog output will be equal to the voltage at the low LSB output 306.

Whenever the fourth bit is in a low voltage state the fourth bit transistor 142 is driven into a low state. Furthermore, whenever the fourth bit is in a low voltage state, the complimentary fourth bit is in a high voltage state. The complimentary fourth bit being in a high voltage state, the fourth bit complimentary transistor 144 is driven into a high state. In this embodiment, the voltage at the low LSB output 306 would be equal to the voltage at the low LSB input 302, and the voltage at the high LSB output 304 would be equal to the voltage at the low LSB output 306 plus a voltage gain equal to the voltage value of one LSB due to voltage stored in the fifth voltage control capacitor 152. In this case, if the fifth bit is in a high voltage state, the fifth bit transistor 146 is driven high while the fifth bit complimentary transistor 148 is driven low. Current may flow through the fifth bit transistor 146, and the voltage at the analog output will be equal to the voltage at the high LSB output 304. If the fifth bit is in a low voltage state, the fifth bit transistor 146 is driven low while the fifth bit complimentary transistor 148 is driven high. Current may flow through the fifth bit complimentary transistor 148, and the voltage at the analog output will be equal to the voltage at the low LSB output 306.

The amplifier termination cell 104 may generate three distinct output voltages for any differential voltage between the high LSB input 300 and the low LSB input 302 based on four possible bit states of the fourth and fifth bits. One output voltage may be equal the voltage at the high LSB input 300, one voltage may be equal to the voltage at the low LSB input 302, and one voltage may be equal to one-half the voltage as measure from the high LSB input 300 to the low LSB input 302. The table below show possible states for the analog output 154 where $V_{high}$ is the voltage at the high LSB input 300 and $V_{low}$ is the voltage at the low LSB input 302. The actual voltages at the high LSB input 300 and the low LSB input 302 are dependent on the number of preceding bit amplifying cells 102, 158, 160 connected in series to the amplifier termination cell 104, and on the digital values of each bit driving each bit amplifying cell 102, 158, 160. In any case, the analog output 154 may pass through a band pass filter to remove undesirable frequencies.

|  | Fourth High Fifth High | Fourth High Fifth Low | Fourth Low Fifth High | Fourth Low Fifth Low |
|---|---|---|---|---|
| Analog Output | $V_{high}$ | $½(V_{high} + V_{low})$ | $1½(V_{high} + V_{low})$ | $V_{low}$ |

Method of Using the Apparatus

Figure 7:
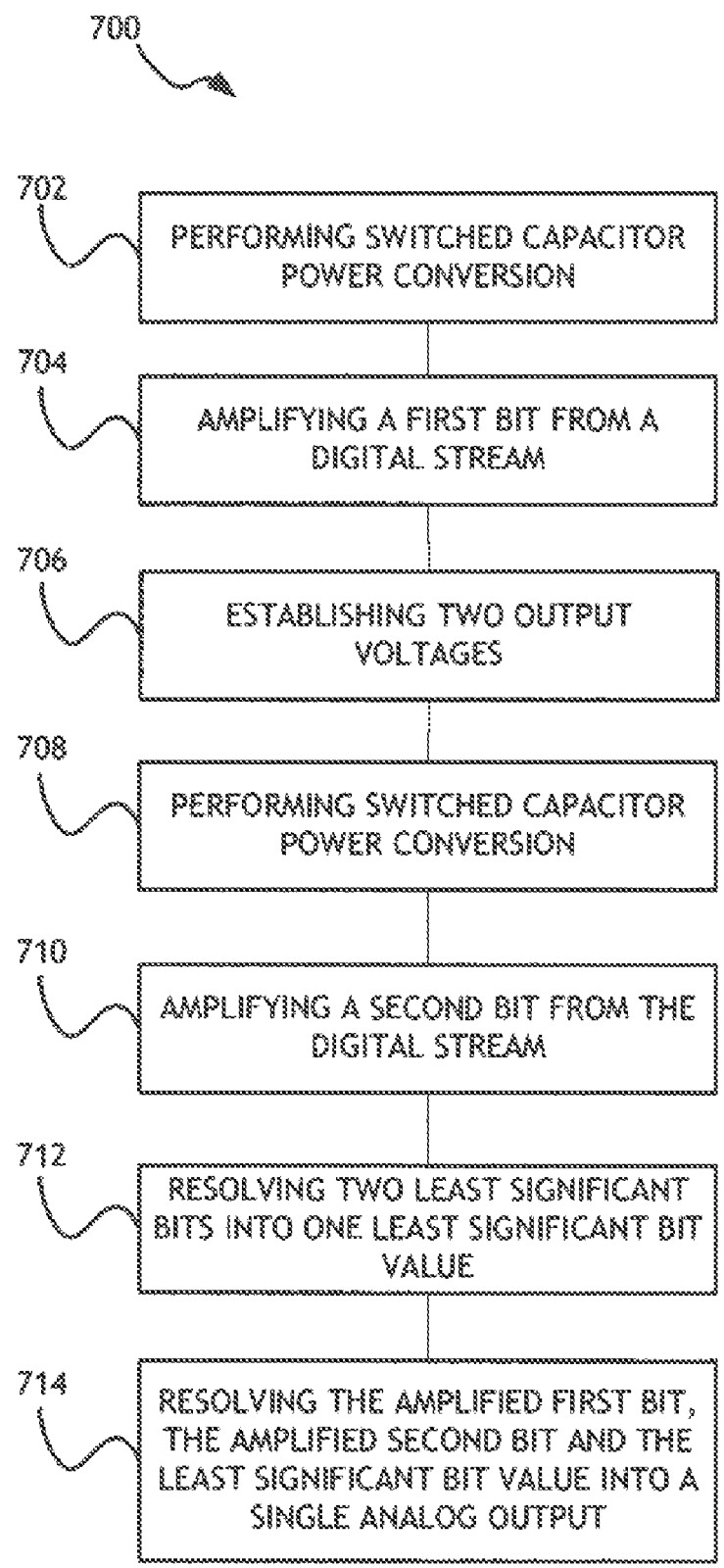
FIG. 7 shows a flowchart of another embodiment of the present invention.

Referring to FIG. 7, in another embodiment 700 of the present invention, an apparatus similar to that disclosed above amplifies individual bits from a digital stream, and converts the amplified bits into a single analog output. The apparatus performs 702 switched capacitor power conversion to create a floating voltage at the common node of two capacitors connected in series. The floating voltage may be one-half the voltage differential at the remaining nodes of the two capacitors. The apparatus amplifies 704 a first bit from the digital stream. In amplifying 704 the first bit, the apparatus establishes 706 two output voltages. The output voltages may vary in magnitude depending on the value of the first bit; however, the output voltages may always have a voltage differential one-half the voltage differential at the non-common nodes of the two capacitors. The apparatus may then perform 708 switched capacitor power conversion to create a floating voltage at the common node of two different capacitors connected in series. The floating voltage may be one-half the voltage differential of the two output voltages. The apparatus amplifies 710 a second bit from the digital stream. The apparatus produces a voltage based on the value of the first bit, the second bit, and a reference voltage. The apparatus may then resolve 712 two least significant bits into one least significant bit voltage that may have one of three possible values based on the values of the two least significant bits and some reference voltage. The apparatus may then resolve 714 the voltage based on the value of the first bit and the value of the second bit, and the least significant bit voltage to produce a single analog output voltage.

It is believed that the present invention and many of its attendant advantages will be understood by the foregoing description, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A digital signal amplifier comprising:
a plurality of bit amplification cells for amplifying individual bits in a digital stream; and
an amplifier termination cell for resolving a voltage differential and one or more least significant bits in a data stream into a single analog output,
wherein the plurality of bit amplification cells are connected in series, and the amplifier termination cell is connected in series to the plurality of bit amplification cells.

2. The apparatus of claim 1 wherein each of the plurality of bit amplification cells comprises:
a high voltage control capacitor;
a low voltage control capacitor connected at a first terminal to a first terminal of the high voltage control capacitor;
a high bit transistor connected at the source to a second terminal of the high voltage control capacitor;
a high bit complimentary transistor connected at the drain to the drain of the high bit transistor, and connected at the source to a common node of the high voltage control capacitor and the low voltage control capacitor;
a low bit complimentary transistor connected at the source to a second terminal of the low voltage control capacitor; and
a low bit transistor connected at the source to the common node of the high voltage control capacitor and the low voltage control capacitor,
wherein the gate of the high bit transistor and the gate of the low bit transistor are connected at a common node, and the gate of the high bit complimentary transistor and the gate of the low bit complimentary transistor are connected at a common node.

3. The apparatus of claim 2 wherein each bit amplification cell performs switched capacitor power conversion across the high voltage control capacitor and the low voltage control capacitor to create a floating voltage source at the common node of the high voltage control capacitor and to low voltage control capacitor.

4. The apparatus of claim 2 wherein each bit amplification cell is configured to receive a high voltage input at the source of the high bit transistor and a low voltage input at the source of the low bit complimentary transistor.

5. The apparatus of claim 4 wherein each bit amplification cell performs switched capacitor power conversion across the high voltage control capacitor and the low voltage control capacitor to create a floating voltage source at the common node of the high voltage control capacitor and to low voltage control capacitor.

6. The apparatus of claim 1 wherein the amplifier termination cell comprises:
a first voltage control capacitor;
a first bit transistor connected at the source to a first terminal of the first voltage control capacitor;
a first bit complimentary transistor connected at the source to a second terminal of the first voltage control capacitor;
a second voltage control capacitor connected at a first terminal to the drain of the first bit transistor and at a second terminal to the drain of the first bit complimentary transistor;
a second bit transistor connected at the source to the drain of the first bit transistor; and
a second bit complimentary transistor connected at the source to the drain of the first bit complimentary transistor and at the drain to the drain of the second bit transistor.

7. The apparatus of claim 6 wherein the amplifier termination cell is configured to receive a high voltage input at the source of the first transistor and a low voltage input at the source of the first complimentary transistor.

8. The apparatus of claim 7 wherein each of the plurality of bit amplification cells comprises:
a high voltage control capacitor;
a low voltage control capacitor connected at a first terminal to a first terminal of the high voltage control capacitor;
a high bit transistor connected at the source to a second terminal of the high voltage control capacitor;
a high bit complimentary transistor connected at the drain to the drain of the high bit transistor, and connected at the source to a common node of the high voltage control capacitor and the to voltage control capacitor;
a low bit complimentary transistor connected at the source to a second terminal of the low voltage control capacitor; and
a low bit transistor connected at the source to the common node of the high voltage control capacitor and the low voltage control capacitor,
wherein the gate of the high bit transistor and the gate of the low bit transistor are connected at a common node, and the gate of the high bit complimentary transistor and the gate of the low bit complimentary transistor are connected at a common node.

9. The apparatus of claim 8 wherein:
the drain of the high bit transistor of a first bit amplification cell in the plurality of bit amplification cells is connected to the source of the high bit transistor in a second bit amplification cell in the plurality of bit amplification cells;
the drain of the high bit complimentary transistor of the first bit amplification cell in the plurality of bit amplification cells is connected to the source of the high bit complimentary transistor in the second bit amplification cell in the plurality of bit amplification cells;
the drain of the high bit transistor of the second bit amplification cell in the plurality of bit amplification cells is connected to the source of the first bit transistor in the amplifier termination cell; and
the drain of the high bit complimentary transistor of the second bit amplification cell in the plurality of bit amplification cells is connected to the source of the first bit complimentary transistor in the amplifier termination cell.

10. A method of amplifying a digital signal comprising:
amplifying a first individual bit from a digital stream with reference to a voltage differential;
amplifying a second digital bit from a digital stream with reference to a voltage differential defined by the output of amplifying the first individual bit from a digital stream; and
resolving a voltage differential created during amplifying a first individual bit from a digital stream and amplifying a second individual bit from a digital stream into a single analog output.

11. The method of claim 10 further comprising resolving two least significant bits from a digital stream into a single least significant bit value, wherein the single least significant bit value is one of three potential values.

12. The method of claim 11 further comprising resolving the single analog value and the single least significant bit value to produce an analog output.

13. The method of claim 10 further comprising amplifying a plurality of individual bits from a digital stream with reference to a voltage differential, wherein each of the plurality of individual bits is amplified within a voltage differential one-half the voltage differential of the next more significant bit in the plurality of individual bits.

14. The method of claim 13 further comprising resolving two least significant bits from a digital stream into a single least significant bit value, wherein the single least significant bit value is one of three potential values.

15. The method of claim 14 further comprising resolving the single analog value and the single least significant bit value to produce an analog output.

16. The method of claim 10 further comprising performing switched capacitor power conversion to create a floating voltage source of one-half the magnitude of the supply preceding it.

17. The method of claim 16 further comprising resolving two least significant bits from a digital stream into a single least significant bit value, wherein the single least significant bit value is one of three potential values.

18. The method of claim 17 further comprising resolving the single analog value and the single least significant bit value to produce an analog output.

19. A digital signal amplification and analog conversion apparatus comprising:
- an amplifier voltage source for providing an amplifying voltage differential;
- a plurality of bit amplifying cells, each bit amplifying cell comprising:
  - a high bit voltage control capacitor;
  - a low bit voltage control capacitor connected at a first terminal to a first terminal of the high bit voltage control capacitor;
  - a high bit transistor connected at the source to a second terminal of the high bit voltage control capacitor;
  - a high bit complimentary transistor connected at the drain to the drain of the high bit transistor, and connected at the source to a common node of the high bit voltage control capacitor and the low bit voltage control capacitor;
  - a low bit complimentary transistor connected at the source to a second terminal of the low bit voltage control capacitor; and
  - a low bit transistor connected at the source to the common node of the high bit voltage control capacitor and the low bit voltage control capacitor,
- wherein:
  - the gate of the high bit transistor and the gate of the low bit transistor are connected at a common node;
  - the gate of the high bit complimentary transistor and the gate of the low bit complimentary transistor are connected at a common node; and
  - each of the plurality of bit amplifying cells is connected in series to another of the plurality of bit amplifying cells;
- an amplifier termination cell comprising:
  - a first voltage control capacitor connected at a first terminal to the drain of the high bit transistor of one of the plurality of bit amplifying cells, and at a second terminal to the drain of the low bit complimentary transistor of the one of the plurality of bit amplifying cells;
  - a first bit transistor connected at the source to the drain of the high bit transistor of the one of the plurality of bit amplifying cells;
  - a first bit complimentary transistor connected at the source to the drain of the low bit complimentary transistor of the one of the plurality of bit amplifying cells;
  - a second voltage control capacitor connected at a first terminal to the drain of the first bit transistor and at a second terminal to the drain of the first bit complimentary transistor;
  - a second bit transistor connected at the source to the drain of the first bit transistor;
  - a second bit complimentary transistor connected at the source to the drain of the first bit complimentary transistor, and connected at the drain to the drain of the second bit transistor,
- wherein an amplified, analog converted output is read from a common node of the second bit transistor and the second bit complimentary transistor.

20. The apparatus of claim 19 wherein at least one of the plurality of bit amplifying cells performs switched capacitor power conversion across high bit voltage control capacitor and the low bit voltage control capacitor to create a floating voltage source at the common node of the high bit voltage control capacitor and to low bit voltage control capacitor.

* * * * *